(12) United States Patent
Lovins-Wilusz et al.

(10) Patent No.: US 12,202,356 B2
(45) Date of Patent: Jan. 21, 2025

(54) MOTOR DEGRADATION IDENTIFICATION SYSTEMS AND METHODS USING MULTIPLE ENVIRONMENTAL FACTORS

(71) Applicant: GM GLOBAL TECHNOLOGY OPERATIONS LLC, Detroit, MI (US)

(72) Inventors: Noah Jon Lovins-Wilusz, Royal Oak, MI (US); Jeffrey M. Pieper, Waterford, MI (US); Vino Mathew, Farmington Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 265 days.

(21) Appl. No.: 18/073,088

(22) Filed: Dec. 1, 2022

(65) Prior Publication Data

US 2024/0181891 A1 Jun. 6, 2024

(51) Int. Cl.
*B60L 3/00* (2019.01)
*B60L 53/20* (2019.01)
(Continued)

(52) U.S. Cl.
CPC ............. *B60L 3/0061* (2013.01); *B60L 53/20* (2019.02); *B60L 58/12* (2019.02); *B60L 58/24* (2019.02);
(Continued)

(58) Field of Classification Search
CPC ........ B60L 3/0061; B60L 53/20; B60L 58/12; B60L 58/24; B60L 2240/423;
(Continued)

(56) References Cited

U.S. PATENT DOCUMENTS 6,297,742 B1 * 10/2001 Canada .................... G07C 3/00
361/23
9,126,588 B2 * 9/2015 Hessell ................. B60W 20/20
(Continued)

FOREIGN PATENT DOCUMENTS

CN 114722862 A * 7/2022
WO WO-2020015996 A1 * 1/2020 ............. H02K 11/25

OTHER PUBLICATIONS

Barbieri et al., Sensor-Based Degradation Prediction and Prognostics for Remaining Useful Life Estimation: Validation on Experimental Data of Electric Motors; 3 Int'l J. Prognostics & Health Mgmt. (Jul. 5, 2016) (DOI: https://doi.org/10.36001/phme.2016.v3i1.1577) (Year: 2016).*

*Primary Examiner* — Tung X Nguyen
*Assistant Examiner* — Robert P Alejnikov, Jr.

(57) ABSTRACT

A system includes: a module configured to: compare operating parameters with predetermined thresholds, respectively; and set indicators for the operating parameters based on the comparisons, respectively; a module configured to: set a first indicator to a first state when all of first ones of the indicators are in a first state; and set the first indicator to a second state when at least one of the first ones of the indicators is in a second state; a module configured to: set a second indicator to a first state when at least one of second ones of the indicators are in a first state; and set the second indicator to a second state when all of the second ones of the indicators are in a second state; and a module configured to indicate whether an electric motor is degraded based on at least one of the first and second indicators.

20 Claims, 6 Drawing Sheets

(51) Int. Cl.
*B60L 58/12* (2019.01)
*B60L 58/24* (2019.01)
*G01R 31/34* (2020.01)

(52) U.S. Cl.
CPC ...... *G01R 31/343* (2013.01); *B60L 2240/423* (2013.01); *B60L 2240/425* (2013.01); *B60L 2240/525* (2013.01); *B60L 2240/54* (2013.01); *B60L 2240/545* (2013.01)

(58) Field of Classification Search
CPC ......... B60L 2240/425; B60L 2240/525; B60L 2240/54; B60L 2240/545; G01R 31/343; G01D 21/02; H02P 27/06
USPC ..................................................... 324/765.01
See application file for complete search history.

(56) References Cited

U.S. PATENT DOCUMENTS

| | | | |
|---|---|---|---|
| 2003/0067277 A1* | 4/2003 | Parlos | H02P 29/02 |
| | | | 318/400.21 |
| 2012/0278007 A1* | 11/2012 | Schleser | H02P 21/20 |
| | | | 702/44 |
| 2021/0175826 A1* | 6/2021 | Zhang | H02P 21/20 |
| 2021/0175835 A1* | 6/2021 | Zhang | H02P 29/027 |
| 2021/0184610 A1* | 6/2021 | Zhang | H02P 21/20 |
| 2021/0281209 A1* | 9/2021 | Vinson | H02P 29/024 |

* cited by examiner

MOTOR DEGRADATION IDENTIFICATION SYSTEMS AND METHODS USING MULTIPLE ENVIRONMENTAL FACTORS

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to electric motor control systems and methods and more particularly to systems and methods for identifying motor degradation.

Vehicles with an engine include a battery for starting the engine and supporting accessory loads. Electric vehicles (EVs) such as battery electric vehicles (BEVs), hybrid vehicles, and/or fuel cell vehicles include one or more electric machines and a battery system including one or more battery cells, modules and/or packs to provide propulsion power. A power control system is used to control power to/from the battery system during charging, propulsion and/or regeneration.

Lithium-ion batteries (LIBs) have high power density and are used in EV and non-EV applications. LIBs include anode electrodes, cathode electrodes and separators. The anode electrodes include active material arranged on opposite sides of a current collector. The cathode electrodes include cathode active material arranged on opposite sides of a current collector.

SUMMARY

In a feature, an electric motor degradation identification system includes: a parameter flag module configured to: compare N operating parameters with N predetermined thresholds, respectively, where N is an integer greater than 2; and set N indicators for the N operating parameters, based on the comparisons, respectively, to one of a first state and a second state; a first module configured to: select first ones of the N indicators; and set a first indicator to a first state when all of the first ones of the N indicators are in the first state; and set the first indicator to a second state when at least one of the first ones of the N indicators is in the second state; a second module configured to: select second ones of the N indicators; and set a second indicator to a first state when at least one of the second ones of the N indicators are in the first state; and set the second indicator to a second state when all of the second ones of the N indicators are in the second state; and a degradation module configured to indicate whether an electric motor is degraded based on at least one of (a) the first indicator and (b) the second indicator.

In further features, the degradation module is configured to indicate that the electric motor is not degraded when both the first indicator is in the second state and the second indicator is in the second state.

In further features, the degradation module is configured to indicate that the electric motor is degraded based on the first indicator and regardless of the second indicator when a third indicator is in a first state.

In further features, the degradation module is configured to, when the third indicator is in the first state, indicate that the electric motor is degraded when the first indicator is in the first state.

In further features, the degradation module is configured to, when the third indicator is in the first state, indicate that the electric motor is not degraded when the first indicator is in the second state.

In further features, the degradation module is configured to indicate that the electric motor is degraded based on the second indicator and regardless of the first indicator when the third indicator is in a second state.

In further features, the degradation module is configured to, when the third indicator is in the second state, indicate that the electric motor is degraded when the second indicator is in the first state.

In further features, the degradation module is configured to, when the third indicator is in the second state, indicate that the electric motor is not degraded when the second indicator is in the second state.

In further features, the degradation module is configured to indicate that the electric motor is degraded based on the second indicator and the first indicator when the third indicator is in a third state.

In further features, the degradation module is configured to, when the third indicator is in the third state, indicate that the electric motor is degraded when at least one of (a) the second indicator is in the first state and (b) the first indicator is in the first state.

In further features: a motor control module is configured to control switching of switches of an inverter module using control parameters, where the inverter module is configured to apply power to the electric motor from a battery; and a parameter adjustment module configured to selectively adjust at least one of the control parameters in response to the degradation module indicating that the electric motor is degraded.

In further features, the control parameters are proportional and integral gains of a proportional integral (PI) controller.

In further features, the N operating parameters include an ambient air temperature.

In further features, the N operating parameters include an ambient air pressure.

In further features, the N operating parameters include a maximum one of a plurality of temperatures of battery modules, respectively, of a battery.

In further features, the N operating parameters include a minimum one of a plurality of temperatures of battery modules, respectively, of a battery.

In further features, the N operating parameters include a state of charge of a battery.

In further features, the N operating parameters include a torque capability of the electric motor.

In further features, the N operating parameters include at least one of a temperature of an inverter module, a temperature of a rotor of the electric motor, and a temperature of the electric motor.

In a feature, an electric motor degradation identification method includes: comparing N operating parameters with N predetermined thresholds, respectively, where N is an integer greater than 2; setting N indicators for the N operating parameters, based on the comparisons, respectively, to one of a first state and a second state; selecting first ones of the N indicators; setting a first indicator to a first state when all of the first ones of the N indicators are in the first state; setting the first indicator to a second state when at least one of the first ones of the N indicators is in the second state; selecting second ones of the N indicators; and setting a second indicator to a first state when at least one of the second ones of the N indicators are in the first state; setting the second indicator to a second state when all of the second ones of the N indicators are in the second state; and indicating whether an electric motor is degraded based on at least one of (a) the first indicator and (b) the second indicator.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A vehicle may include one or more electric motors, such as for propulsion, for internal combustion engine starting, and/or for one or more other vehicle functions. Degradation of the motor could be determined based on one or more comparisons of one or more motor powers with one or more respective thresholds.

The present application involves identifying electric motor degradation based on various operating parameters, such as ambient temperature, ambient pressure, battery maximum temperature, battery minimum temperature, battery average temperature, state of charge, motor torque capabilities, inverter temperature(s), rotor temperature(s), other motor temperature(s), etc. Which one or more parameters to use to detect motor degradation can be calibrated. Whether selected parameters should be considered together (e.g., in a logic AND operation) and whether selected parameters should be considered individually (e.g., in a logic OR operation) can also be calibrated. Whether to consider selected parameters together and/or individually can also be calibrated for the determination of motor degradation. When motor degradation is detected, one or more control parameters (e.g., closed loop gains) can be adjusted for the motor degradation. This improves motor control, improves engine startability, provides better motor/engine coordination, and provides other benefits.

Figure 1:
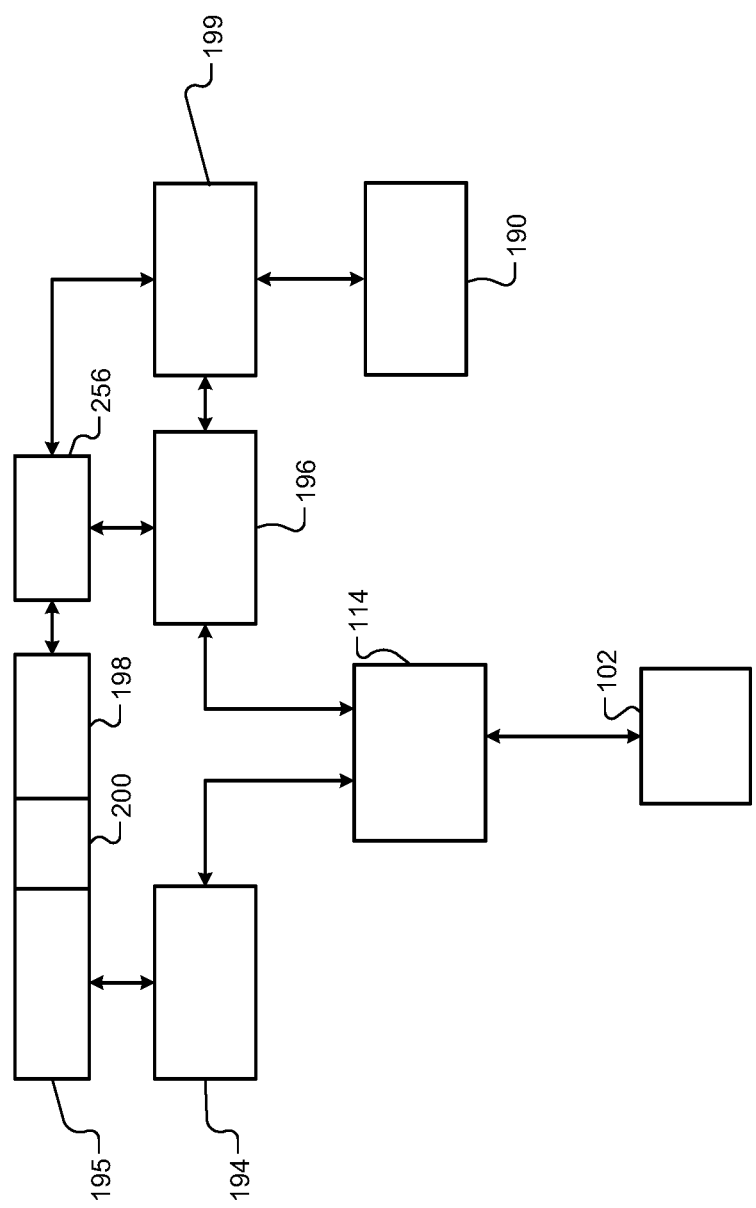
FIG. 1 is a functional block diagram of an example vehicle system.

Referring now to FIG. 1, a functional block diagram of an example vehicle system is presented. While a vehicle system for a hybrid vehicle is shown and will be described, the present disclosure is also applicable to electric vehicles that do not include an internal combustion engine (including pure electric vehicles), fuel cell vehicles, autonomous vehicles, and other types of vehicles. Also, while the example of a vehicle is provided, the present application is also applicable to non-vehicle implementations.

An engine 102 may combust an air/fuel mixture to generate drive torque. An engine control module (ECM) 114 controls the engine 102. For example, the ECM 114 may control actuation of engine actuators, such as a throttle valve, one or more spark plugs, one or more fuel injectors, valve actuators, camshaft phasers, an exhaust gas recirculation (EGR) valve, one or more boost devices, and other suitable engine actuators. In some types of vehicles (e.g., electric vehicles), the engine 102 may be omitted.

The engine 102 may output torque to a transmission 195. A transmission control module (TCM) 194 controls operation of the transmission 195. For example, the TCM 194 may control gear selection within the transmission 195 and one or more torque transfer devices (e.g., a torque converter, one or more clutches, etc.).

The vehicle system includes one or more electric motors, such as electric motor 198. An example implementation including more than one electric motor is described below. An electric motor can act as either a generator or as a motor at a given time. When acting as a generator, an electric motor converts mechanical energy into electrical energy. The electrical energy can be, for example, used to charge a battery 199. When acting as a motor, an electric motor generates torque that may be used, for example, for vehicle propulsion. While the example of one electric motor is provided, the vehicle may include more than one electric motor. In various implementations, the electric motor 198 may be used to start the engine 102, such as via a belt.

A motor control module 196 controls power flow from the battery 199 to the electric motor 198 and from the electric motor 198 to the battery 199. The motor control module 196 applies electrical power from the battery 199 to the electric motor 198 to cause the electric motor 198 to output positive torque, such as for vehicle propulsion or to start the engine 102. The battery 199 may include, for example, one or more battery modules. Each battery module may include a plurality of battery cells.

The electric motor 198 may output torque, for example, to an input shaft of the transmission 195 or to an output shaft of the transmission 195, or to a wheel of the vehicle. A clutch 200 may be engaged to couple the electric motor 198 to the transmission 195 and disengaged to decouple the electric motor 198 from the transmission 195. One or more gearing devices may be implemented between an output of the clutch 200 and an input of the transmission 195 to provide a predetermined ratio between rotation of the electric motor 198 and rotation of the input of the transmission 195.

The motor control module 196 may also selectively convert mechanical energy of the vehicle into electrical energy. More specifically, the electric motor 198 generates and outputs power when the electric motor 198 is being driven by the transmission 195 and the motor control module 196 is not applying power to the electric motor 198 from the battery 199. The motor control module 196 may charge the battery 199 via the power output by the electric motor 198.

The vehicle may include a charge port 190. A power source, such as a charging station, another vehicle, or another suitable source of power may connect to and charge the battery 199 via the charge port 190. The battery 199 may also be used to power other devices (e.g., other vehicles) via the charge port 190.

Figure 2:
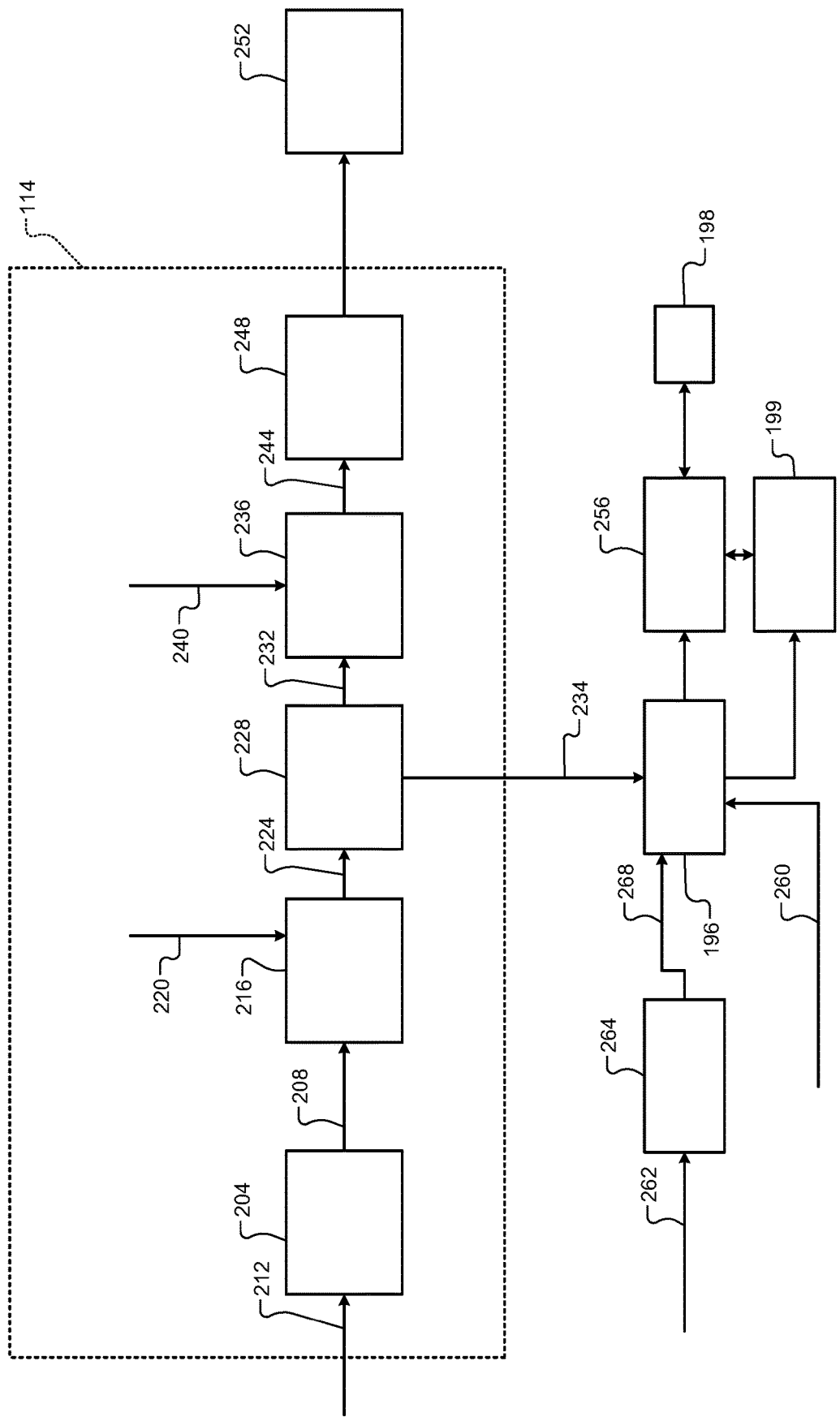
FIG. 2 is a functional block diagram of an example propulsion control system.

Referring now to FIG. 2, a functional block diagram of an example propulsion control system is presented. A driver torque module 204 determines a driver torque request 208 based on driver input 212. The driver input 212 may include, for example, an accelerator pedal position (APP), a brake pedal position (BPP), cruise control input, and/or an autonomous input. In various implementations, the cruise control input may be provided by an adaptive cruise control system that attempts to maintain at least a predetermined distance between the vehicle and objects in a path of the vehicle. The autonomous input may be provided by an autonomous driving system that controls movement of a vehicle from location to location while avoiding objects and other vehicles. The driver torque module 204 determines the driver torque request 208 based on one or more lookup tables that relate the driver inputs to driver torque requests. The APP and BPP may be measured using one or more APP sensors and BPP sensors, respectively.

The driver torque request 208 may be an axle torque request. Axle torques (including axle torque requests) refer to torque at the wheels. As discussed further below, propulsion torques (including propulsion torque requests) are different than axle torques in that propulsion torques may refer to torque at a transmission input shaft.

An axle torque arbitration module 216 arbitrates between the driver torque request 208 and other axle torque requests 220. Axle torque (torque at the wheels) may be produced by various sources including the engine 102 and/or one or more electric motors, such as the electric motor 198. Examples of the other axle torque requests 220 include, but are not limited to, a torque reduction requested by a traction control system when positive wheel slip is detected, a torque increase request to counteract negative wheel slip, brake management requests to reduce axle torque to ensure that the axle torque does not exceed the ability of the brakes to hold the vehicle when the vehicle is stopped, and vehicle over-speed torque requests to reduce the axle torque to prevent the vehicle from exceeding a predetermined speed. The axle torque arbitration module 216 outputs one or more axle torque requests 224 based on the results of arbitrating between the received axle torque requests 208 and 220.

In hybrid vehicles, a hybrid module 228 may determine how much of the one or more axle torque requests 224 should be produced by the engine 102 and how much of the one or more axle torque requests 224 should be produced by the electric motor 198. The example of the electric motor 198 will be continued for simplicity in conjunction with the example of FIG. 2, but multiple electric motors may be included, such as discussed below with respect to the example of FIG. 3. The hybrid module 228 outputs one or more engine torque requests 232 to a propulsion torque arbitration module 236. The engine torque requests 232 indicate a requested torque output of the engine 102.

The hybrid module 228 also outputs a motor torque request 234 to the motor control module 196. The motor torque request 234 indicates a requested torque output (positive or negative) of the electric motor 198. In vehicles where the engine 102 is omitted (e.g., electric vehicles) or is not connected to output propulsion torque for the vehicle, the axle torque arbitration module 216 may output one axle torque request and the motor torque request 234 may be equal to that axle torque request. In the example of an electric vehicle, the ECM 114 may be omitted, and the driver torque module 204 and the axle torque arbitration module 216 may be implemented within the motor control module 196.

In electric vehicles, the driver torque module 204 may input the driver torque request 208 to the motor control module 196 and the components related to controlling engine actuators may be omitted. In the example of multiple electric motors, the motor control module 196 may determine how much torque should be produced by each of the electric motors. The electric motors may be controlled to achieve the same or different amounts of torque.

The propulsion torque arbitration module 236 converts the engine torque requests 232 from an axle torque domain (torque at the wheels) into a propulsion torque domain (e.g., torque at an input shaft of the transmission). The propulsion torque arbitration module 236 arbitrates the converted torque requests with other propulsion torque requests 240. Examples of the other propulsion torque requests 240 include, but are not limited to, torque reductions requested for engine over-speed protection and torque increases requested for stall prevention. The propulsion torque arbitration module 236 may output one or more propulsion torque requests 244 as a result of the arbitration.

An actuator control module 248 controls actuators 252 of the engine 102 based on the propulsion torque requests 244. For example, based on the propulsion torque requests 244, the actuator control module 248 may control opening of a throttle valve, timing of spark provided by spark plugs, timing and amount of fuel injected by fuel injectors, cylinder actuation/deactivation, intake and exhaust valve phasing, output of one or more boost devices (e.g., turbochargers, superchargers, etc.), opening of an EGR valve, and/or one or more other engine actuators. In various implementations, the propulsion torque requests 244 may be adjusted or modified before use by the actuator control module 248, such as to create a torque reserve.

The motor control module 196 controls switching of switches of an inverter module 256 based on the motor torque request 234. Switching of the inverter module 256 controls power flow from the battery 199 to the electric motor 198. As such, switching of the inverter module 256 controls torque output of the electric motor 198. The inverter module 256 also converts power generated by the electric motor 198 and outputs power to the battery 199, for example, to charge the battery 199.

The motor control module 196 may control switching of switches of the inverter module 256, for example, based on adjusting a torque 260 output of the motor 198 toward or to the motor torque request 234 using a closed loop control module. For example, the closed loop control module may include a proportional integral (PI) control module or another suitable type of closed loop control module. The torque 260 of the motor 198 may be measured using a torque sensor or estimated (e.g., by the motor control module 196) based on one or more operating parameters, such as using one or more equations and/or lookup tables.

The inverter module 256 includes the plurality of switches. The motor control module 196 switches the switches to convert DC power from the battery 199 into alternating current (AC) power and to apply the AC power to the electric motor 198 to drive the electric motor 198. For example, the inverter module 256 may convert the DC power from the battery 199 into n-phase AC power and apply the n-phase AC power to (e.g., a, b, and c, or u, v, and w) n stator windings of the electric motor 198. In various implementations, n is equal to 3. Magnetic flux produced via current flow through the stator windings drives a rotor of the electric motor 198. The rotor is connected to and drives rotation of an output shaft of the electric motor 198.

In various implementations, one or more filters may be electrically connected between the inverter module 256 and the battery 199. The one or more filters may be implemented, for example, to filter power flow to and from the battery 199. As an example, a filter including one or more capacitors and resistors may be electrically connected in parallel with the inverter module 256 and the battery 199.

While the battery 199 is discussed in conjunction with the vehicle, the present application is also applicable to uses of the battery 199 in other types of devices including non-vehicle applications.

A motor degradation module 264 identifies degradation of the motor 198 based on a plurality of operating parameters 262 as discussed further below. When degradation of the motor 198 is detected, the motor degradation module 264 adjusts one or more control parameters 268 of the motor control module 196 (e.g., gain values of the PI control module) or provides the motor control module 196 with a set of control parameters 268. The motor control module 196 then uses the control parameters 268 to control switching of the switches if the inverter module 256.

Figure 3:
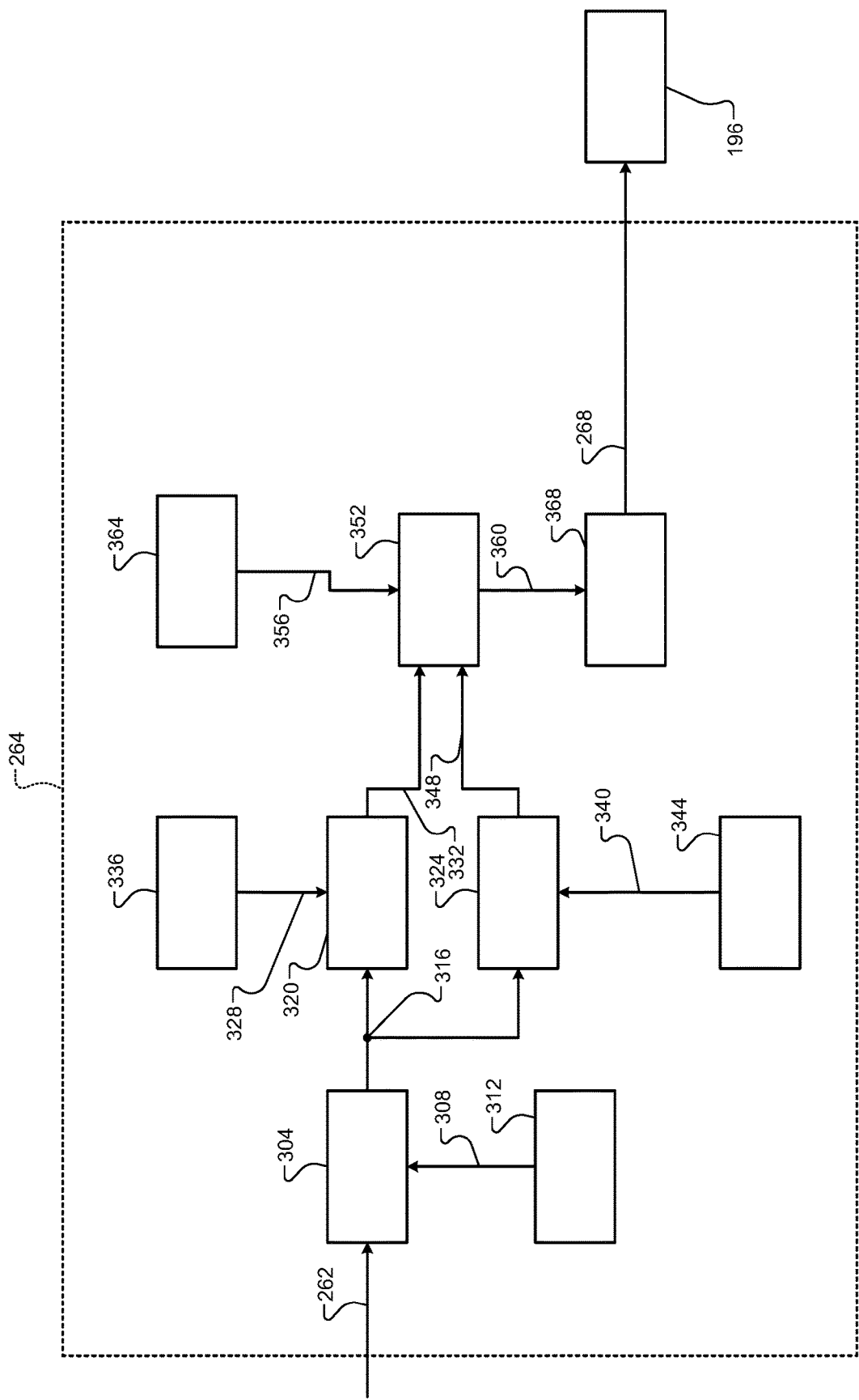
FIG. 3 is a functional block diagram of an example implementation of a motor degradation module.

FIG. 3 is a functional block diagram of an example implementation of the motor degradation module 264. The motor degradation module 264 includes a parameter flag module 304 that compares the operating parameters 262 with respective thresholds 308.

The operating parameters 262 may include, for example, an ambient air temperature outside of the vehicle, an ambient air pressure outside of the vehicle, a maximum temperature of the battery modules of the battery 199, a minimum temperature of the battery modules of the battery 199, and an average of the temperatures of the battery 199. The temperature of each battery module may be measured, and the maximum temperature may be the greatest one of the temperatures of the battery modules, respectively. The minimum temperature may be the least one of the temperatures of the battery modules, respectively. The average may be an average of the temperatures of the battery modules, respectively (e.g., the sum of all of the temperatures divided by the total number of battery modules). The ambient temperature and pressure may be measured using sensors.

The operating parameters 262 may also include a state of charge of the battery 199, one or more motor torque capabilities of the motor 198, one or more temperatures of the inverter module 256, one or more temperatures of a rotor of the motor 198, and one or more other temperatures of the motor 198. The temperatures of the inverter module 256 may be measured using temperature sensors or estimated based on one or more other parameters. The one or more temperatures of a rotor of the motor 198 may be measured using one or more sensors or estimated based on one or more other parameters. The one or more other temperatures of the motor 198 may be measured using one or more temperature sensors or estimated based on one or more other parameters. The operating parameters 262 may additionally or alternatively include one or more other operating parameters.

A thresholds module 312 provides the thresholds 308. The thresholds 308 may be, for example, stored in memory. The thresholds 308 may include an upper threshold and a lower threshold for each one of the operating parameters 262. For example, the thresholds 308 may include an upper ambient air temperature threshold and a lower ambient air temperature threshold, an upper ambient air pressure threshold and a lower ambient air pressure threshold, etc. In various implementations, the thresholds module 312 may select the thresholds 308 (e.g., a set of the thresholds) based on one or more operating parameters.

The parameter flag module 304 sets parameters flags 316 based on the comparisons, respectively. For example, the parameter flag module 304 sets a parameter flag (one of the parameters flags 316) for the ambient temperature based on the comparisons of the ambient temperature with the upper and lower ambient air temperature thresholds. For example only, the parameter flag module 304 may set the parameter flag for the ambient temperature to true (e.g., a first state) when the ambient temperature is greater than the upper ambient air temperature threshold. The parameter flag module 304 may maintain the parameter flag for the ambient temperature in the true state until the ambient temperature becomes less than the lower ambient air temperature threshold. The parameter flag module 304 may then set the parameter flag for the ambient temperature to false (e.g., a second state) until the ambient temperature again becomes greater than the upper ambient air pressure threshold.

As another example, the parameter flag module 304 sets a parameter flag (one of the parameters flags 316) for the ambient pressure based on the comparisons of the ambient pressure with the upper and lower ambient air pressure thresholds. For example only, the parameter flag module 304 may set the parameter flag for the ambient pressure to true (e.g., a first state) when the ambient pressure is greater than the upper ambient air pressure threshold. The parameter flag module 304 may maintain the parameter flag for the ambient pressure in the true state until the ambient temperature becomes less than the lower ambient air pressure threshold. The parameter flag module 304 may then set the parameter flag for the ambient pressure to false (e.g., a second state) until the ambient pressure again becomes greater than the upper ambient air pressure threshold. The parameter flag module 304 does this for each of the operating parameters 262.

While the example of setting a parameter flag to true when the operating parameter becomes greater than the upper threshold and setting the parameter flag to false when the operating parameter becomes less than the lower threshold is provided, for one or more of the operating parameters 262 the parameter flag module 304 may set a parameter flag to true when the operating parameter becomes less than the lower threshold and set the parameter flag to false when the operating parameter becomes greater than the upper threshold.

An AND module 320 and an OR module 324 receive the parameter flags 316. An AND flag indicator 328 indicates which one or more of the parameter flags 316 to perform a logic AND operation on. The AND module 320 sets an AND flag 332 to true (e.g., a first state) when all of the one or more of the parameter flags 316 indicated by the AND flag indicator 328 are set to true (e.g., the first state). The AND module 320 sets the AND flag 332 to false (e.g., a second state) when at least one of the one or more of the parameter flags indicated by the AND flag indicator 328 are set to false (e.g., the second state). An AND selection module 336 provides the AND flag indicator 328. The AND flag indicator 328 may be, for example, stored in memory. In various implementations, the AND selection module 336 may select the AND flag indicator 328 (e.g., a set of the parameter flags 316) based on one or more operating parameters.

An OR flags indicator 340 indicates which one or more of the parameter flags 316 to perform a logic OR operation on. The OR module 324 sets an OR flag 348 to true (e.g., a first state) when at least one of the one or more of the parameter flags 316 indicated by the OR flag indicator 340 are set to true (e.g., the first state). The OR module 324 sets the OR flag 348 to false (e.g., a second state) when all of the one or more of the parameter flags indicated by the OR flag indicator 340 are set to false (e.g., the second state). An OR selection module 344 provides the OR flag indicator 340. The OR flag indicator 340 may be, for example, stored in memory. In various implementations, the OR selection module 344 may select the OR flag indicator 340 (e.g., a set of the parameter flags 316) based on one or more operating parameters.

A degradation module 352 determines and indicates whether the motor 198 is degraded based at least one of the AND flag 332 and the OR flag 348. An AND/OR indicator 356 indicates whether the degradation module 352 should determine whether the motor 198 is degraded based on the AND flag 332, the OR flag 348, or both the AND flag 332 and the OR flag 348.

For example, when the AND/OR indicator 356 is in a first state, the degradation module 352 may determine whether the motor 198 is degraded based the AND flag 332 and not the OR flag 348. For example, when the AND/OR indicator 356 is in the first state, the degradation module 352 may set a degradation indicator 360 to a first state indicative of the motor 198 being degraded when the AND flag 332 is true. The degradation module 352 may set the degradation indicator 360 to a second state indicative of the motor 198 not being degraded when the AND flag 332 is false.

When the AND/OR indicator 356 is in a second state, the degradation module 352 may determine whether the motor 198 is degraded based the OR flag 348 and not the AND flag 332. For example, when the AND/OR indicator 356 is in the second state, the degradation module 352 may set the degradation indicator 360 to the first state indicative of the motor 198 being degraded when the OR flag 348 is true. The degradation module 352 may set the degradation indicator 360 to the second state indicative of the motor 198 not being degraded when the OR flag 348 is false.

When the AND/OR indicator 356 is in a third state, the degradation module 352 may determine whether the motor 198 is degraded based the OR flag 348 and the AND flag 332. For example, when the AND/OR indicator 356 is in the second state, the degradation module 352 may set the degradation indicator 360 to the first state indicative of the motor 198 being degraded when at least one of (a) the AND flag 332 is true and (b) the OR flag 348 is true. The degradation module 352 may set the degradation indicator 360 to the second state indicative of the motor 198 not being degraded when both (a) the AND flag 332 is false and (b) the OR flag 348 is false.

An AND/OR selection module 364 may set the state of the AND/OR indicator 356. The state to which to set the state of the AND/OR indicator 356 may be calibrated and stored in memory.

When the degradation indicator 360 is in the first state (indicative of degradation of the motor 198), one or more actions may be taken. For example, a parameter adjustment module 368 selectively adjusts one or more of the control parameters 268 (e.g., PI gain values) of the motor control module 196 when the degradation indicator 360 is in the first state. This adjusts control of the switching of the inverter module 256 to account for the degradation of the motor 198. When the degradation indicator 360 is in a second state (indicative of the motor 198 not being degraded), the parameter adjustment module 368 may not adjust the control parameters 268 of the motor control module 196 and leave the control parameters of the motor control module 196 unchanged.

In various implementations, the engine control module 114 may adjust control of the engine actuators 252 based on the adjustment of the control parameter(s) for the degradation of the motor 198. In this manner, the torque output of the engine 102 may compensate for a decrease in torque output of the motor 198 attributable to the degradation of the motor 198.

Figure 4:
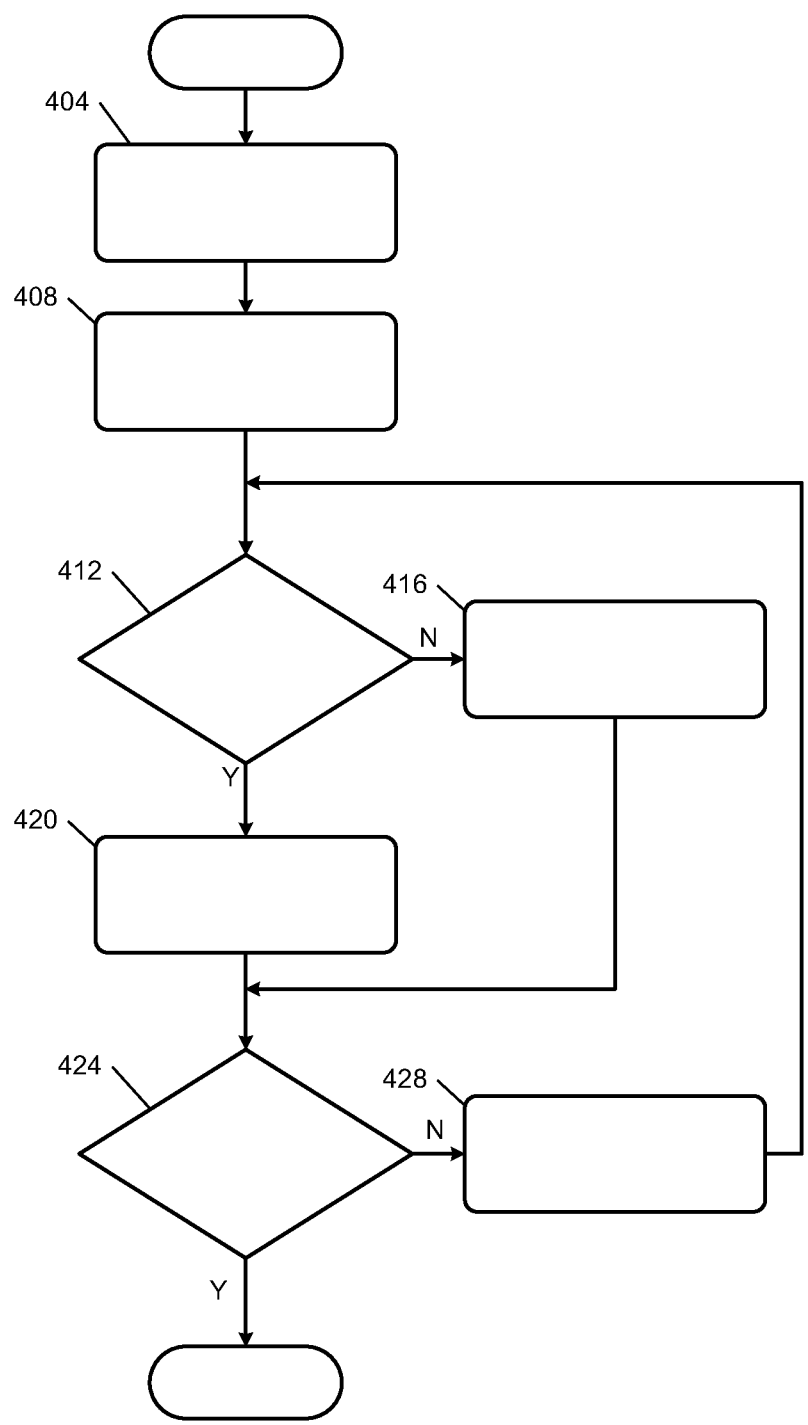
FIGS. 4-6 are a flowchart depicting an example method of identifying and remediating degradation of the motor.
Figure 5:
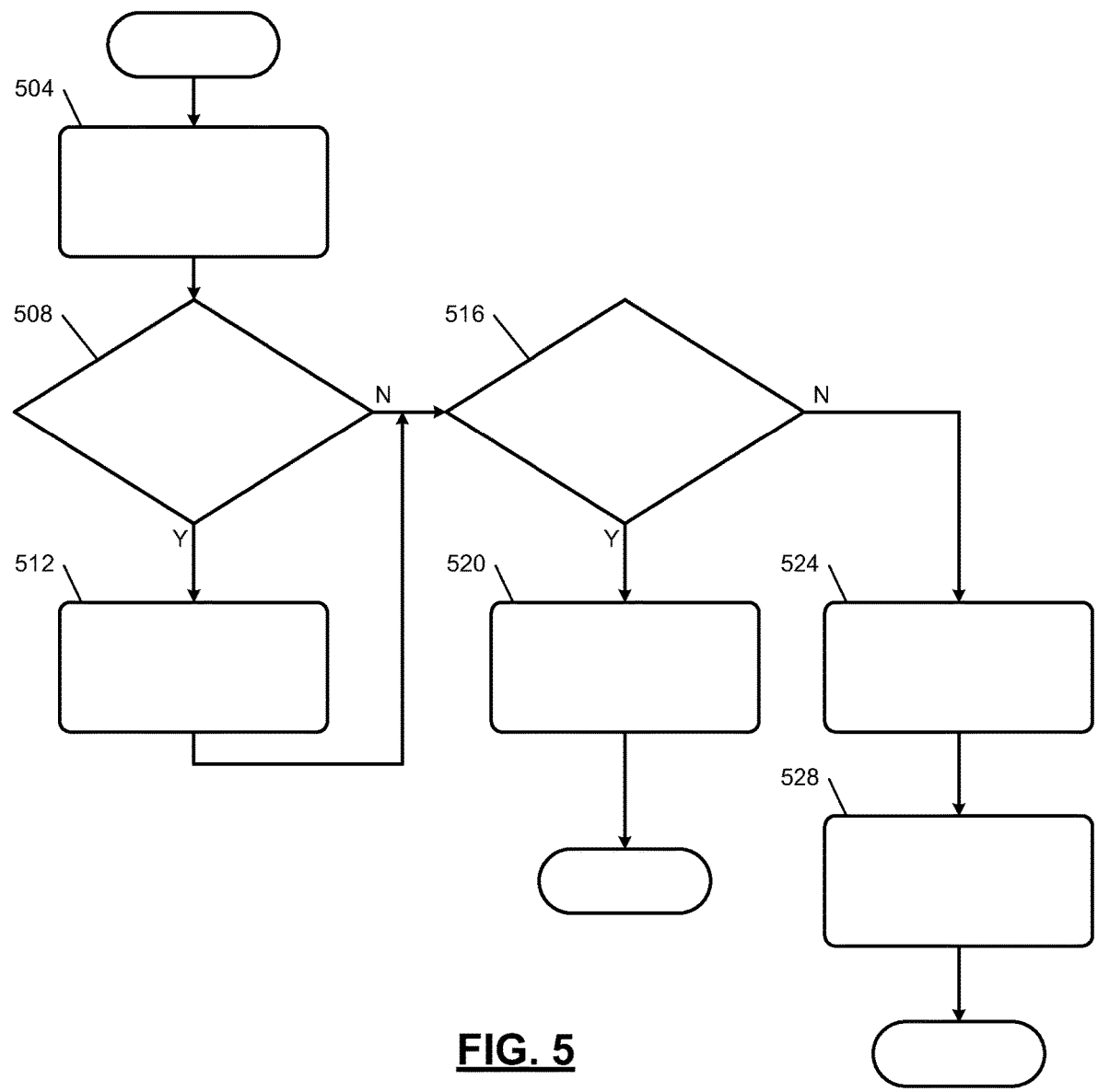
Figure 6:
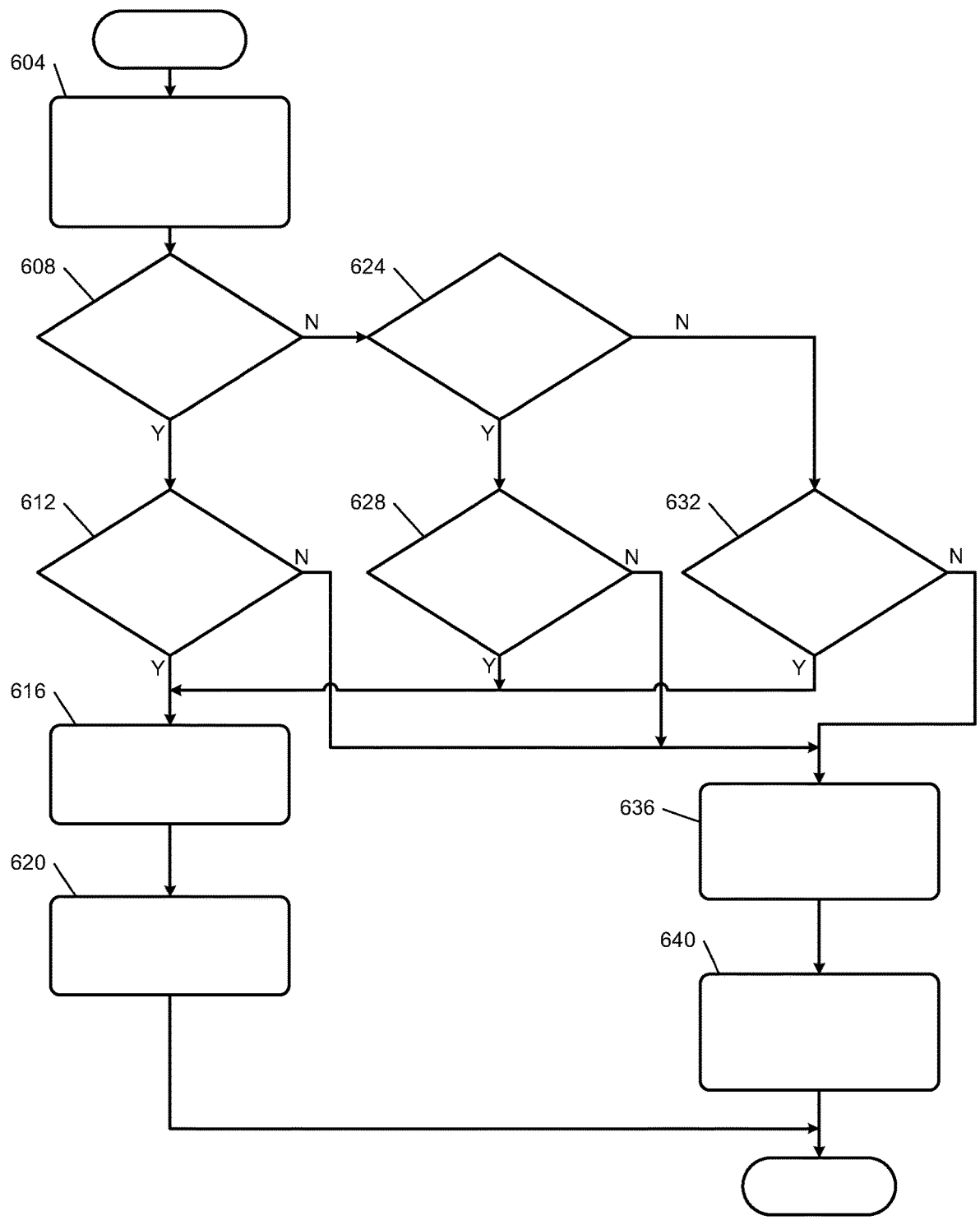

FIGS. 4-6 are a flowchart depicting an example method of identifying degradation of the motor 198. Control begins with 404 where the parameter flag module 304 receives the operating parameters 262. At 408, the parameter flag module 304 sets a counter value N to 1. At 412, the parameter flag module 304 selects the N-th one of the operating parameters 262 and determines whether the N-th one of the operating parameters 262 is greater than (or less than) its respective one of the thresholds 308. If 412 is false, the parameter flag module 304 sets the N-th one of the parameter flags 316 for the N-th one of the operating parameters 262 to false (a second state) at 416, and control continues to 424. If 412 is true, the parameter flag module sets the N-th one of the parameter flags 316 for the N-th one of the operating parameters 262 to true (a first state) at 420, and control continues to 424. Once the N-th one of the operating parameters 262 is greater than (or less than) its respective one of the thresholds 308 such that the N-th one of the parameter flags 316 is true, the parameter flag module 304 may apply hysteresis and maintain the N-th one of the parameter flags 316 true until the N-th one of the operating parameters 262 becomes less than (or greater than) its respective one of the thresholds 308.

At 424, the parameter flag module 304 determines whether the counter value N is equal to the total number of the operating parameters 262. For example, the operating parameters 262 include 10 different operating parameters, the total number would be equal to 10. The present application, however, is also applicable to other numbers of operating parameters. The total number may be, for example, at least 5, 6, 7, 8, 9, or 10. If 424 is true, control transfers to A of FIG. 5. If 424 is false, the parameter flag module 304 increments the counter value N at 428 (e.g., set N=N+1), and control returns to 412. In this manner, each of the operating parameters 262 is compared with its respective threshold and the respective parameter flags 316 are set.

Referring to FIG. 5, at 504, the AND module 320 receives the AND flag indicator 328, and the OR module 324 receives the OR flags indicator 340. The AND flag indicator 328 indicates which ones of the N parameter flags 316 to use in the AND operation. The OR flags indicator 340 indicates which ones of the N parameter flags 316 to use in the OR operation.

At 508, the AND module 320 determines whether all of the ones of the N parameter flags 316 indicated by the AND flag indicator 328 are true. If 508 is true, the AND module 320 sets the AND flag 332 to true at 512, and control continues with 516. If 508 is false, the AND module 320 sets the AND flag 332 to false, and control transfers to 516.

At 516, the OR module 324 determines whether at least one of the ones of the N parameter flags 316 indicated by the OR flags indicator 340 are true. If 516 is true, the OR module 324 sets the OR flag 348 to true at 520, and control continues with B of FIG. 6. If 516 is false, the OR module 324 sets the OR flag 348 to false, and control transfers to 524. At 524, because both the OR flag 348 and the AND flag 332 are false, the degradation module 352 sets the degradation indicator 360 to the second state (e.g., false) indicative of no degradation of the motor 198. At 528, because the degradation indicator 360 is in the second state, the parameter adjustment module 368 maintains (and does not adjust) the control parameters 268 of the motor control module 196.

Referring now to FIG. 6, at 604 the degradation module 352 receives the AND/OR indicator 356 indicative of whether to use (1) the AND flag 332 (not the OR flag 348), (2) the OR flag 348 (not the AND flag 332), or (3) both the AND flag 332 and the OR flag 348 in determining whether the motor 198 is degraded. At 608, the degradation module 352 determines whether the AND/OR indicator 356 indicates to use (1) the AND flag 332 (and not the OR flag 348). If 608 is true, control continues with 612. If 608 is false, control transfers to 624, which is discussed further below.

At 612, the degradation module 352 determines whether the AND flag 332 is set to true (a first state). If 612 is true, the degradation module 352 sets the degradation indicator 360 to the first state to indicate that the motor 198 is degraded at 616. At 620, the parameter adjustment module 368 adjusts one or more of the control parameters 268 (e.g., PI gain values) of the motor control module 196. If 612 is false, control transfers to 636.

At 624, the degradation module 352 determines whether the AND/OR indicator 356 indicates to use (2) the OR flag 348 (and not the AND flag 332). If 624 is true, control continues with 628. If 624 is false, control transfers to 632, which is discussed further below.

At 628, the degradation module 352 determines whether the OR flag 348 is set to true (a first state). If 628 is true, the degradation module 352 sets the degradation indicator 360 to the first state to indicate that the motor 198 is degraded at 616. At 620, the parameter adjustment module 368 adjusts one or more of the control parameters 268 (e.g., PI gain values) of the motor control module 196. If 628 is false, control transfers to 636.

If 624 is false, the AND/OR indicator 356 indicates to use (3) both the OR flag 348 and the AND flag 332. At 632, the degradation module 352 determines whether at least one of the OR flag 348 is set to true (a first state) and the AND flag 332 is set to true (a first state). In other words, the degradation module 352 determines whether either the OR flag 348 OR the AND flag 332 is set to true (a first state). If 632 is true, the degradation module 352 sets the degradation indicator 360 to the first state to indicate that the motor 198 is degraded at 616. At 620, the parameter adjustment module 368 adjusts one or more of the control parameters 268 (e.g., PI gain values) of the motor control module 196. If 632 is false, control continues with 636.

At 636, the degradation module 352 sets the degradation indicator 360 to the second state (e.g., false) indicative of no degradation of the motor 198. At 640, because the degradation indicator 360 is in the second state, the parameter adjustment module 368 maintains (and does not adjust) the control parameters 268 of the motor control module 196. While control is shown as ending, control may return to 404 for a next control loop.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. An electric motor degradation identification system comprising:
   a parameter flag module configured to:
      compare N operating parameters with N predetermined thresholds, respectively,
         wherein N is an integer greater than 2; and
      set N indicators for the N operating parameters based on the comparisons, respectively, to one of a first state and a second state;
   a first module configured to:
      select first ones of the N indicators;
      set a first indicator to a first state when all of the first ones of the N indicators are in the first state; and
      set the first indicator to a second state when at least one of the first ones of the N indicators is in the second state;
   a second module configured to:
      select second ones of the N indicators;
      set a second indicator to a first state when at least one of the second ones of the N indicators are in the first state; and
      set the second indicator to a second state when all of the second ones of the N indicators are in the second state; and
   a degradation module configured to indicate whether an electric motor is degraded based on at least one of (a) the first indicator and (b) the second indicator.

2. The electric motor degradation identification system of claim 1 wherein the degradation module is configured to indicate that the electric motor is not degraded when both the first indicator is in the second state and the second indicator is in the second state.

3. The electric motor degradation identification system of claim 1 wherein the degradation module is configured to indicate that the electric motor is degraded based on the first indicator and regardless of the second indicator when a third indicator is in a first state.

4. The electric motor degradation identification system of claim 3 wherein the degradation module is configured to, when the third indicator is in the first state, indicate that the electric motor is degraded when the first indicator is in the first state.

5. The electric motor degradation identification system of claim 3 wherein the degradation module is configured to, when the third indicator is in the first state, indicate that the electric motor is not degraded when the first indicator is in the second state.

6. The electric motor degradation identification system of claim 3 wherein the degradation module is configured to indicate that the electric motor is degraded based on the second indicator and regardless of the first indicator when the third indicator is in a second state.

7. The electric motor degradation identification system of claim 6 wherein the degradation module is configured to, when the third indicator is in the second state, indicate that the electric motor is degraded when the second indicator is in the first state.

8. The electric motor degradation identification system of claim 6 wherein the degradation module is configured to, when the third indicator is in the second state, indicate that the electric motor is not degraded when the second indicator is in the second state.

9. The electric motor degradation identification system of claim 6 wherein the degradation module is configured to indicate that the electric motor is degraded based on the second indicator and the first indicator when the third indicator is in a third state.

10. The electric motor degradation identification system of claim 9 wherein the degradation module is configured to, when the third indicator is in the third state, indicate that the electric motor is degraded when at least one of (a) the second indicator is in the first state and (b) the first indicator is in the first state.

11. The electric motor degradation identification system of claim 1 further comprising:
   a motor control module configured to control switching of switches of an inverter module using control parameters,
      wherein the inverter module is configured to apply power to the electric motor from a battery; and
   a parameter adjustment module configured to selectively adjust at least one of the control parameters in response to the degradation module indicating that the electric motor is degraded.

12. The electric motor degradation identification system of claim 11 wherein the control parameters are proportional and integral gains of a proportional integral (PI) controller.

13. The electric motor degradation identification system of claim 1 wherein the N operating parameters include an ambient air temperature.

14. The electric motor degradation identification system of claim 1 wherein the N operating parameters include an ambient air pressure.

15. The electric motor degradation identification system of claim 1 wherein the N operating parameters include a maximum one of a plurality of temperatures of battery modules, respectively, of a battery.

16. The electric motor degradation identification system of claim 1 wherein the N operating parameters include a minimum one of a plurality of temperatures of battery modules, respectively, of a battery.

17. The electric motor degradation identification system of claim 1 wherein the N operating parameters include a state of charge of a battery.

18. The electric motor degradation identification system of claim 1 wherein the N operating parameters include a torque capability of the electric motor.

19. The electric motor degradation identification system of claim 1 wherein the N operating parameters include at least one of a temperature of an inverter module, a temperature of a rotor of the electric motor, and a temperature of the electric motor.

20. An electric motor degradation identification method comprising:
- comparing N operating parameters with N predetermined thresholds, respectively,
- wherein N is an integer greater than 2;
- setting N indicators for the N operating parameters based on the comparisons, respectively, to one of a first state and a second state;
- selecting first ones of the N indicators;
- setting a first indicator to a first state when all of the first ones of the N indicators are in the first state;
- setting the first indicator to a second state when at least one of the first ones of the N indicators is in the second state;
- selecting second ones of the N indicators; and
- setting a second indicator to a first state when at least one of the second ones of the N indicators are in the first state;
- setting the second indicator to a second state when all of the second ones of the N indicators are in the second state; and
- indicating whether an electric motor is degraded based on at least one of (a) the first indicator and (b) the second indicator.

* * * * *